US006417740B1

(12) United States Patent
Anh et al.

(10) Patent No.: US 6,417,740 B1
(45) Date of Patent: Jul. 9, 2002

(54) WIDE-BAND/MULTI-BAND VOLTAGE CONTROLLED OSCILLATOR

(75) Inventors: Do Manh Anh; Zhao Ruiyan; Ma Jian-Guo; Yeo Kiat Seng; Chew Kok Wai, all of Singapore (SG)

(73) Assignee: Chartered Semiconductor Manufacturing Ltd. (SG)

( * ) Notice: Subject to any disclaimer, the term of this patent is extended or adjusted under 35 U.S.C. 154(b) by 0 days.

(21) Appl. No.: 09/791,444

(22) Filed: Feb. 22, 2001

(51) Int. Cl.[7] .............................. H03B 5/08; H03B 5/12

(52) U.S. Cl. ..................... 331/48; 331/45; 331/117 R; 331/117 FE; 331/177 R; 331/177 V; 331/179

(58) Field of Search .................................. 331/36 C, 45, 331/46, 48, 117 R, 117 FE, 117 D, 177 R, 177 V, 179

(56) References Cited

U.S. PATENT DOCUMENTS

| 5,166,560 A |   | 11/1992 | Liu |
| 5,635,876 A | * | 6/1997  | Gerrits et al. ................. 331/45 |
| 5,912,596 A | * | 6/1999  | Ghoshal ................. 331/117 R |
| 6,188,292 B1 | * | 2/2001 | Liu .............................. 331/45 |

OTHER PUBLICATIONS

Changku Hwang, Masaru Kokubo, Hirokazu Aoki, Ieice Trans. Fundamentals, vol. E82–A No. 3, Mar. 1999 "Low Voltage/Low Power CMOS VCO"; pp. 424, 426–430.
Ahmadreza Rodougaran, Jacob Rael, Maryann Rofougaran, Asad Abidi, A 900 MHZ Cmos LC–Oscillator with Quadrature Outputs, IEEE International Solid–State Circuits Conference 1996, 0–7803–5126–6/99, Session 24, Analog Techniques, Paper SP 24.6, Electrical Engineering Department, University of California, Los Angeles, CA; pp. 392, 393.

Behzad Razavi, "A 1.8 GHz CMOS Voltage–Controlled Oscillator", IEEE International Solid–State Circuits Conference 1997,0–7803–3721–2/97, Session 23, Analog Techniques, Paper SP 23.6, University of California, Los Angeles, CA; pp. 388, 389.

Christopher Lam, Behzad Razavi, "A 2.6 GHz / 5.2 GHz CMOS Voltage–Controlled Oscillator" IEEE International Solid–State Circuits Conference 1999, Session 23, Paper WP 23.6, University of California, Los Angeles, CA; pp. 402, 403, 484.

(List continued on next page.)

*Primary Examiner*—David Mis
(74) *Attorney, Agent, or Firm*—Stattler Johansen & Adeli, LLP

(57) ABSTRACT

A variable frequency signal generator, in the form of a voltage controlled oscillator, provides wide-band and/or multi-band output frequency operation using two control voltage inputs. A pair of LC oscillator circuits are cross-coupled through a transconductance control circuit. The oscillator circuits provide quadrature output frequency signals. The oscillator circuits include MOSFET varactors controllable by a first control voltage which can be used to drive the varactors into inversion or depletion operating modes which correspond to respective output signal frequency bands. A second control voltage is provided to the transconductance control circuit to control currents injected from each oscillator to the other, thereby selecting a particular output frequency within the range of the frequency band determined by the first control voltage. A control voltage compensation circuit is included to prevent variations in the second control voltage from altering the frequency band range selected by the first control voltage. Output signals with frequencies in the range 850 MHz to 2.4 GHz with favorable harmonic content and low phase noise are possible with relatively low supply voltages.

17 Claims, 10 Drawing Sheets

OTHER PUBLICATIONS

Ting–Ping Liu, "A 6.5GHz Monolithic CMOS Voltage–Controlled Oscillator", IEEE International Solid–State Circuits Conference 1999, 0–7803–5126–6/99, Session 23, Paper WP 23.7, Bell Labs, Lucent Technologies, Holmdel, NJ; pp. 404, 405, 484.

Pete Campbell, "Voltage–Controlled Oscillator Design", Thesis Chapter 2, Center for Integrated Electronics and Electronics Manufacturing, RPI, California; Jul. 7, 2000; pp. 1–29.

* cited by examiner

WIDE-BAND/MULTI-BAND VOLTAGE CONTROLLED OSCILLATOR

FIELD OF THE INVENTION

This invention relates to the field of voltage controlled oscillator circuits.

BACKGROUND OF THE INVENTION

Advances in communications systems have brought on a large increase in the demand for communications devices such as mobile/cellular telephones and radios, portable digital telecommunications and data devices, and the like. Typically such devices operate at a frequency within a band of the electromagnetic spectrum from about 900 MHz to about 2.5 GHz. For example, a cellular mobile telephone may transmit and receive signals at about 1800 MHz, and in order to do so the radio circuitry requires an oscillator tuned to that frequency. Other types of devices of course operate at different frequencies and therefore require an oscillator circuit tuned to a different frequency.

Voltage controlled oscillator (VCO) circuits are known which allow the oscillation frequency thereof to be controllably tuned through use of a control voltage. Known controllable oscillator circuits are useful in devices that operate over a range of frequencies or at a plurality of different frequencies, since only a single oscillator circuit is necessary. However, the frequency range of current VCO circuits is somewhat limited and such circuits are incapable of spanning the entire frequency band used for present and proposed applications such as those mentioned above. Some limitations to the controllable frequency range of known VCO circuits are inherent in the circuit structure or components and others are imposed by the desired application. For example, many of the applications for VCO circuits are in battery powered mobile devices which require low power consumption and operate at low supply voltages. This compounds the restricted range of known VCO circuits since the available range of control voltages that may be applied to the circuit to adjust the frequency is limited.

It is therefore desirable to provide a voltage controlled oscillator circuit that is capable of operating over a wide band of frequencies, or over a plurality of frequency bands, and which may operate using a relatively low supply voltage so as to be useful for battery powered applications.

SUMMARY OF THE INVENTION

In accordance with the principles of the present invention, there is provided a variable frequency signal generator having a pair of LC oscillator circuits interconnected by a transconductance control circuit. The variable frequency signal generator has two independently controllable inputs, and the two oscillator circuits provide respective quadrature output frequency signals.

A first control input is coupled to the oscillator circuits, and is preferably used to control the capacitance of varactors included in the oscillator circuits. In the preferred mode of operation, the first control input receives a first input voltage selected from first and second voltage levels corresponding to varactor capacitance values toward the respective upper and lower extremes of the capacitance range of the varactors. For example, the first voltage level applied at the first control input may drive the varactors into a strong inversion mode operation, and the second voltage level may correspond to a depletion mode operation.

A second control input is coupled to the transconductance control circuit, and is preferably used to control the amount of cross-coupling between the oscillator circuits, which varies the output frequency of the oscillator circuits. In the preferred mode of operation, the second control input receives a second control voltage that can be selected from within a voltage range. In the preferred embodiment, with the first voltage level applied at the first control input, the second control voltage can control the oscillator output frequency between about 840 MHz and 1.37 GHz. With the second voltage level applied at the first control input, the second control voltage can effect variation of the oscillator output frequency between about 1.30 GHz and 2.42 GHz.

In a preferred form of the invention, the variable frequency signal generator also includes a control voltage compensation circuit coupled between the first and second control inputs. The control voltage compensation circuit is controlled by the voltage on the second control input to regulate a bias voltage across the oscillator circuit varactors such that, with a constant voltage at the first control input, the bias voltage across the varactors is maintained substantially constant. This allows the varactors to operate at a fixed bias voltage, and thus maintain a substantially fixed capacitance, despite voltage level variations at the second control input.

In one form of the invention, the variable frequency signal generator may be characterized by:

- first and second LC oscillator circuits including voltage controlled capacitance elements;
- a first control voltage input coupled to the LC oscillator circuits to control the capacitance of the voltage controlled capacitance elements;
- a transconductance control circuit cross-coupling the first and second LC oscillator circuits;
- a second control voltage input coupled to the transconductance control circuit to control transconductance coupling between the first and second oscillator circuits; and
- a variable frequency signal output coupled to generate an output signal from one of the first and second oscillator circuits, wherein the frequency of the output signal is controllable by independently controlling the voltages at the first and second control voltage inputs.

Preferably, each of the first and second LC oscillator circuits comprise a pair of transistors cross-coupled to first and second common nodes; and a respective LC load coupled to each of the first and second common nodes, each LC load comprising an inductive element coupled between the common node and a supply voltage and a varactor capacitive element coupled between the common node and a controlled voltage node. The first and second common nodes provide input/output connections for coupling to the transconductance control circuit and the variable frequency signal output.

Preferably, the transconductance control circuit comprises first and second coupling circuits, each coupling circuit having a pair of inputs and a pair of outputs. The coupling circuits cross-coupled the oscillator circuits, such that:

- the inputs of the first coupling circuit are coupled to the common nodes of the first oscillator circuit, and the outputs of the first coupling circuit are coupled to the common nodes of the second oscillator circuit; and
- the inputs of the second coupling circuit are coupled to the common nodes of the second oscillator circuit, and the outputs of the second coupling circuit are coupled to the common nodes of the first oscillator circuit.

In the preferred form of the invention each of the coupling circuits comprises a pair of coupling transistors having first conduction nodes forming the coupling circuit outputs and second conduction nodes coupled to a supply voltage through a control transistor, the coupling transistors having control nodes forming said coupling circuit inputs, and the control transistor having a control node coupled to the second control voltage input.

In the preferred embodiment, the control voltage compensation circuit includes a resistive element that provides a controlled voltage drop between the first control voltage input and the controlled voltage node so as to maintain the potential difference between the common nodes of said oscillator circuits and the controlled voltage node substantially constant with respect to changes in voltage at the second control voltage input.

In accordance with the present invention, there is also provided a method of operating a variable frequency signal generator having a pair of LC oscillator circuits interconnected by a transconductance control circuit, the oscillator circuits having outputs that in use provide respective quadrature frequency output signals, the oscillator circuits having a first control voltage input and the transconductance control circuit having a second control voltage input. The method comprises: applying a first control voltage to the oscillator circuits through said first control voltage input, the first control voltage being selected from first and second predetermined voltage levels corresponding to first and second output signal frequency bands; and applying a second control voltage to the transconductance control circuit through said second voltage input, the second control voltage being within a predetermined voltage range corresponding to an output signal frequencies within the first and second frequency bands. Preferably the oscillator circuits include MOSFET varactors, wherein the first and second predetermined voltage levels correspond to the MOSFET varactors operating in respective strong inversion and depletion modes.

BRIEF DESCRIPTION OF THE DRAWINGS

The invention is described in greater detail hereinafter, by way of example only, through description of a preferred embodiment thereof and with reference to the accompanying drawings in which.

DETAILED DESCRIPTION OF THE PREFERRED EMBODIMENT

The structure and operation of a voltage controlled oscillator circuit is disclosed herein. In the following description, for purposes of explanation, specific nomenclature and specific implementation details are set forth to provide a thorough understanding of the present invention. However, it will be apparent to one skilled in the art that these specific details are not required in order to practice the present invention. For example, the preferred embodiment is described in the context of a CMOS integrated circuit technology, but the voltage controlled oscillator circuit structure of the invention is equally applicable to other integrated circuit fabrication technologies.

Figure 1:
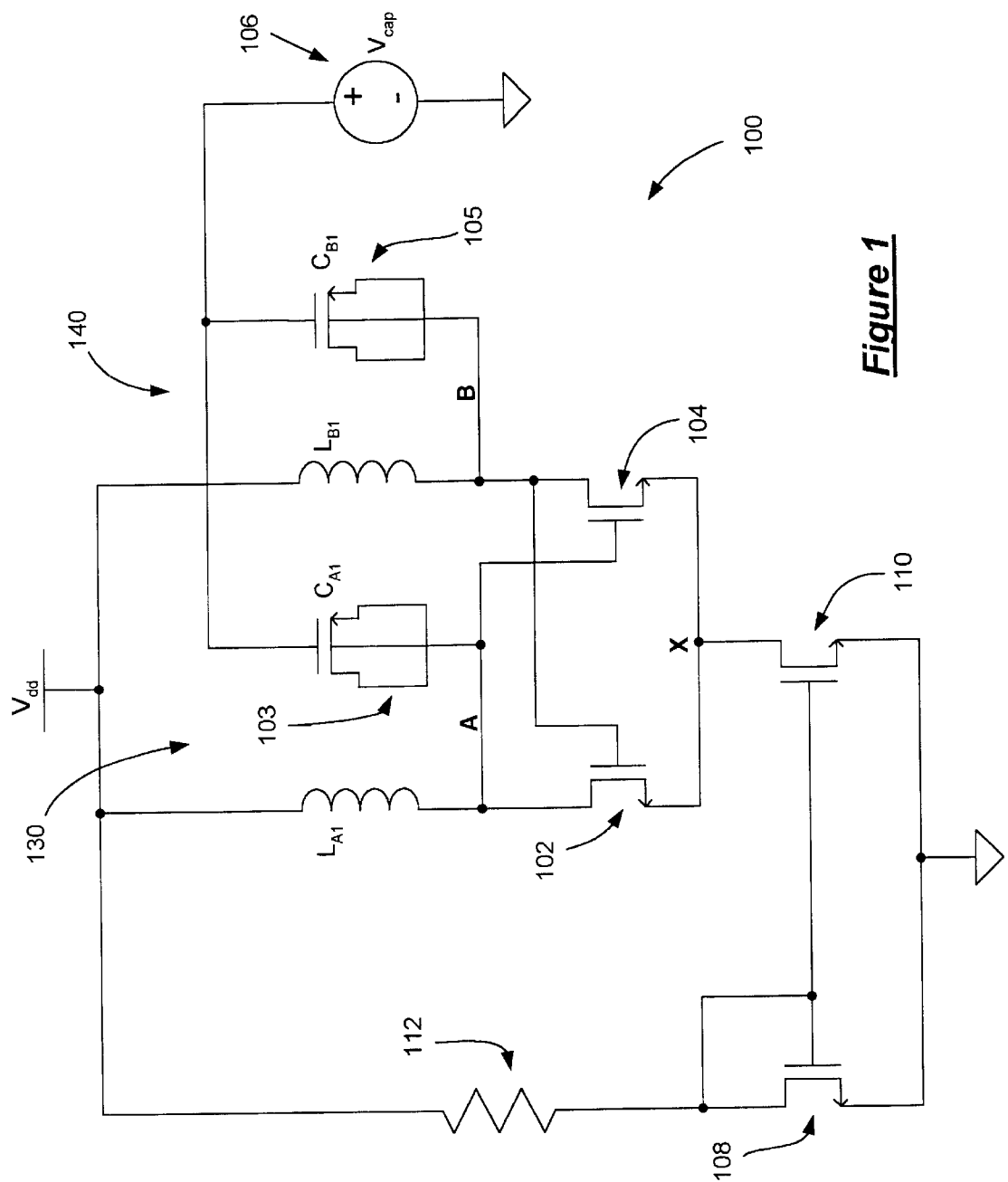
FIG. 1 is a schematic circuit diagram of a first prior art voltage controlled oscillator (VCO) circuit.
Figure 2:
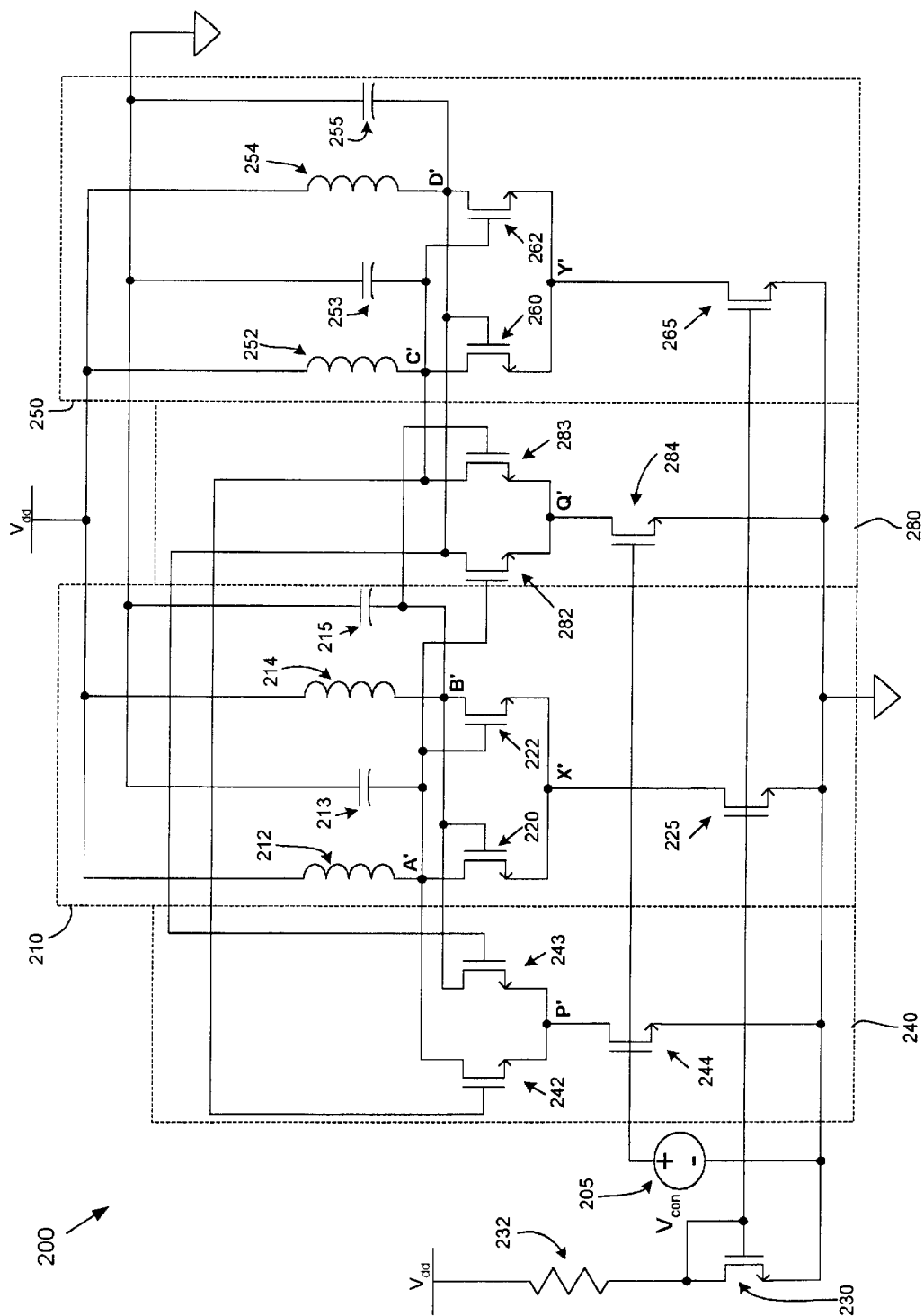
FIG. 2 is a schematic circuit diagram of a second prior art voltage controlled oscillator (VCO) circuit.

Before considering the structure and operation of the voltage controlled oscillator circuit of the present invention, it is useful to refer to two forms of prior art voltage controlled oscillator circuits, which are shown respectively in FIGS. 1 and 2.

A first prior art VCO circuit 100 is shown in schematic circuit diagram form in FIG. 1. The circuit 100 comprises two tuned circuits 130, 140 coupled together to form a resonant circuit. The first tuned circuit 130 has a node A to which is coupled the gate of a transistor 103 constructed in the form of a voltage controlled capacitor (varactor) $C_{A1}$. The other side of the varactor $C_{A1}$ is coupled to the positive side of a controlled voltage source 106 that provides a voltage $V_{cap}$. An inductive element $L_{A1}$ is coupled between the first tuned circuit node A and a fixed supply voltage $V_{dd}$. the first tuned circuit also includes a cross-coupling transistor 102 having its drain coupled to the node A and source coupled to a common node X. The common node X is coupled to ground through a current mirror transistor 110.

The second tuned circuit 140 is constructed similarly to the first tuned circuit 130 as described above. The second tuned circuit 140 has a node B to which a transistor 105 in the form of a varactor $C_{B1}$ and an inductive element $L_{B1}$ are connected. The varactor and inductor $C_{B1}$ and $L_{B1}$ are coupled generally in parallel to the controlled and fixed voltage sources $V_{cap}$ and $V_{dd}$, respectively. A cross-coupling transistor 104 is coupled between the node B and the common node X.

The first and second tuned circuits 130 and 140 are coupled together through cross-coupling transistors 102, 104 to form a resonant circuit. This is achieved by coupling the gate of cross-coupling transistor 102 from the first tuned circuit 130 to the node B of the second tuned circuit 140. Similarly the gate of transistor 104 is cross-coupled to the first tuned circuit 130 at node A.

Current through the common node X is maintained constant by a current mirror circuit that includes the aforementioned transistor 110. The current mirror circuit also includes a current control transistor 108 and a resistive element 112 that are connected in series between the fixed voltage source $V_{dd}$ and ground. The gate of transistors 108 and 110 are coupled together and also coupled to the drain junction of transistor 108 and resistor 112. The current mirror circuit operates in conventional manner, maintaining a substantially constant current through node X.

The VCO circuit 100 as above described and illustrated in FIG. 1 provides an oscillating output voltage at node A or node B, and the frequency of the output is determined by the resonant frequency of the cross-coupled first and second tuned circuits 130, 140. The resonant frequency of the two tuned circuits is controlled by the voltages across the varactors $C_{A1}$, and $C_{B1}$ (nominally the same). Mathematically, the resonant frequency $f_{res}$ can be determined according to:

$$f_{res} = \frac{1}{2\pi\sqrt{LC_{var}}}$$

where L represents the inductance of $L_{A1}$ and $L_{B1}$, and $C_{var}$ represents the capacitance of the varactors $C_{A1}$, and $C_{B1}$.

The circuit is operated such that as the control voltage $V_{cap}$ increases, the capacitances of the varactors decrease, thus increasing the resonant frequency of the circuit. Typically the capacitance of the varactors $C_{A1}$, and $C_{B1}$ can be varied, through use of the control voltage $V_{cap}$, by about 50% of their nominal value, which allows an increase in resonant frequency of the circuit of about 40%. This places an inherent limitation on the frequency range available through this form of circuit.

Another problem of the circuit 100 arises through distortion effects. It is found that the output waveform suffers from an unavoidable effect of harmonic distortion. This is because the variations of the time-variant voltage of the oscillation at nodes A and B in FIG. 1 vary the effective bias voltages across the varactors. This will, in turn, vary the capacitance of varactors within each period. Further, if quadrature outputs are required, 90 degree phase-shifter circuits are employed, and it is also found that problems can arise due to errors in the phase-shifters with respect to changes in the output frequency. Finally, all parasitic capacitances which are in parallel with the capacitances of the varactors further limit the frequency range of the circuit, through lowering the contribution of the varactors to the total capacitance of the LC resonator.

Another form of VCO circuit 200 is shown schematically in FIG. 2. The VCO circuit 200 includes two basic oscillators cross-coupled to generate quadrature outputs. The oscillator circuits 210, 250 each comprise cross-coupled LC resonant circuits similar in structure to the VCO circuit 100 except with fixed capacitances in place of the varactor diodes.

The first oscillator circuit 210 has nodes A' and B', to which are coupled respective inductors and capacitors, and a common node X'. In particular, an inductor 212 is coupled from node A' to supply voltage $V_{dd}$, and a capacitor 213 is coupled from node A' to ground. Similarly, an inductor 214 is coupled from node B' to Supply $V_{dd}$ and capacitor 215 is coupled between node B' and ground. A transistor 220 is connected between node A' and common node X', and another transistor 222 between nodes B' and X'. The transistors 220 and 222 provide cross-coupling between the nodes A' and B', whereby the gate of transistor 220 is coupled to node B' and the gate of transistor 222 is coupled to node A'. The common node X' is connected to ground through a current mirror transistor 225. Electrical current that flows through the current mirror transistor 225 is maintained substantially constant during operation by a reference current circuit comprising resistor 232 and transistor 230 which are coupled to the transistor 225 in a conventional current mirror arrangement.

The second oscillator circuit 250 is constructed similarly to the first oscillator circuit 210, having nodes C' and D' and a common node Y'. Inductors 252 and 254 are connected between $V_{dd}$ and nodes C' and D', respectively. Capacitors 253 and 255 are coupled from ground to nodes C' and D', respectively. Transistor 260 connects node C' to node Y' and is controlled from node D', whilst transistor 262 connects nodes D' and Y' and is controlled from node C'. Current through common node Y' is controlled through current mirror transistor 265, which is regulated by the aforementioned reference current circuit comprising transistor 230 and resistor 232.

In the VCO circuit 200, the frequency of oscillation of the oscillator circuits 210 and 250 can be varied through the use of current injection circuits 240, 280. The current injection circuits also interconnect the first and second oscillator circuits such that quadrature outputs are generated. In particular, exact 90 degree shifted quadrature outputs are obtainable between the outputs at nodes A' and C', or at nodes B' and D'.

The first current injection circuit 240 includes transistors 242 and 243 having their source terminals connected in common to a node P'. The node P' is coupled to ground through a current control transistor 244 having its gate controlled by a voltage source 205 that provides a control voltage $V_{con}$. Transistor 242 has its drain terminal coupled to node A' of oscillator circuit 210 and gate terminal coupled to node C' of oscillator circuit 250. Transistor 243 has its drain terminal coupled to node B' of oscillator circuit 210 and gate terminal coupled to node D' of oscillator circuit 250.

The second current injection circuit 280 has transistors 282 and 283 coupled to a common node Q', and the node Q' is coupled to ground through current control transistor 284. The gate of transistor 284 is controlled by the voltage $V_{con}$ from voltage source 205. Transistor 282 has its drain terminal coupled to node D' of oscillator circuit 250 and gate terminal coupled to node A' of oscillator circuit 210. Transistor 283 has its drain terminal coupled to node C' of oscillator circuit 250 and gate terminal coupled to node B' of oscillator circuit 210.

The operation and characteristics of the VCO circuit 200 is described in Ting-Ping Liu, "A 6.5 GHz Monolithic CMOS Voltage-Controlled Oscillator", ISSCC Digest of Technical Papers, pp 404–405, February 1999. Controlling the voltage $V_{con}$ controls the currents through transistors 242, 243, 282 and 284, which injects currents into the resonant circuits at nodes A', B', D' and C', respectively. These additional currents increase the output frequency of the VCO to a higher value than the natural resonant frequency dictated by the fixed inductance and capacitance values. The mathematical relationship determining the output frequency of the VCO 200 can be expressed as:

$$\phi\{Z(j\omega_{out})\} = \tan_{-1} m$$

In this case $Z(j\omega)$ is the impedance of the resonant circuit determined by the inductance and capacitance values. The symbol m represents the ratio of transconductances of transistors in the resonant circuits and the current injection circuits, i.e.:

$$m = g_{m242}/g_{m220} = g_{m243}/g_{m222} = g_{m282}/g_{m262} = g_{m283}/g_{m260}$$

where $g_{m242}$ is the transconductance of transistor 242, and so on. Therefore, it can be seen that by controlling the voltage $V_{con}$ it is possible to control the injected currents through transistors 242, 243, 282, 283, thereby controlling the transconductances of those transistors and thus the oscillator frequency.

It will be appreciated that, in the VCO circuit 200, the nominal values of the capacitors 213, 215, 253, 255 are all the same, as are the nominal values of the inductors 212, 214, 252, 254. The transistors 220, 222, 260, 262 are designed with like characteristics, and transistors 242, 243, 282, 283 are also of the same structure as each other.

The frequency of the VCO circuit 200 is determined by the transconductance ratios of coupling transistors, as described above, which allows a greater controllable frequency range as compared to the VCO circuit 100 which utilizes MOSFET varactors. Also, the VCO circuit 200 provides an output signal with generally lower harmonic distortion than the circuit 100. However, the tuning range of the circuit 200 is less than one octave, which is still insufficient for many desired applications. The limitation on frequency range comes into effect in the circuit 200 due to saturation of the transistor transconductances occurring above a certain applied control voltage.

Figure 3:
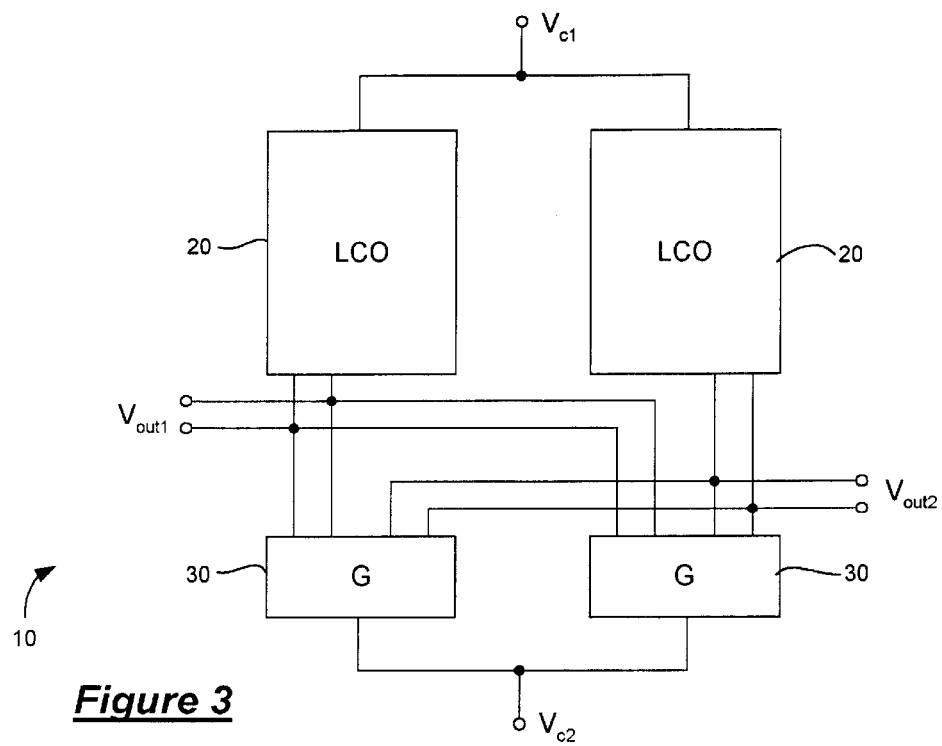
FIG. 3 is a block diagram of a variable frequency signal generator according to an embodiment of the present invention.

A block diagram of a variable frequency signal generator circuit 10 according to an embodiment of the present invention is illustrated in FIG. 3. The variable frequency signal generator 10 includes two control voltage inputs $V_{c1}$ and $V_{c2}$, and has quadrature voltage signal outputs $V_{out1}$ and $V_{out2}$. The variable frequency signal generator 10 comprises two LC oscillators 20 which are cross-coupled by way of transconductance control circuits 30. The first control voltage input $V_{c1}$ is supplied to the LC oscillators 20 and the second control voltage input $V_{c2}$ controls the transconductance control circuits 30.

Figure 4:
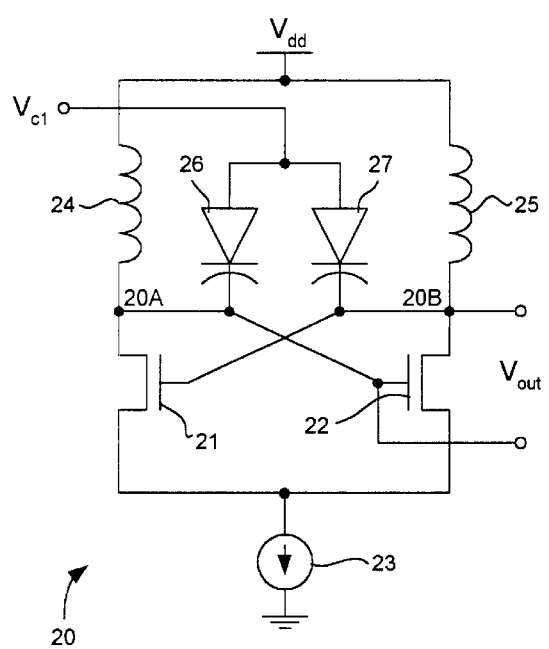
FIG. 4 is a schematic circuit diagram of an LC oscillator circuit suitable for use in the variable frequency signal generator of FIG. 3.

An example of an LC oscillator circuit 20 suitable for use in the variable frequency signal generator architecture 10 is illustrated in schematic diagram form in FIG. 4. The LC oscillator 20 comprises a pair of transistors 21, 22 that are supplied by a common current source 23, and are cross-coupled to nodes 20A and 20B. Each of the nodes 20A and 20B are loaded by respective inductors 24, 25, and voltage-controlled variable capacitance elements in the form of varactor diodes 26, 27. The inductors are coupled between the nodes 20A, 20B and supply voltage $V_{dd}$, whilst the varactor diodes are supplied from the first control voltage $V_{c1}$. The nodes 20A, 20B provide output to and input from the transconductance control circuits 30 (FIG. 3), and also provide the output signals for the variable frequency signal generator 10.

Figure 5:
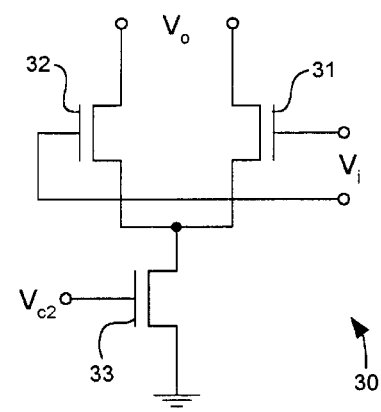
FIG. 5 is a schematic circuit diagram of a transconductance control coupling circuit suitable for use in the variable frequency signal generator of FIG. 3.

An example of a transconductance control circuit 30 suitable for use in the variable frequency signal generator architecture 10 is illustrated in schematic diagram form in FIG. 5. The transconductance control circuit 30 comprises two input/output transistors 31, 32 which have their source terminals coupled to ground through a control transistor 33. The gate terminals of the I/O transistors 31, 32 provide input ($V_{c1}$) to the circuit 30 from one of the LC oscillators 20, and the drain terminals of the I/O transistors provide output ($V_O$) to the other one of the LC oscillators. The second control voltage $V_{c2}$ is supplied at the gate of the control transistor 33.

In operation of the variable frequency signal generator 10, variation of either of the first and second control voltages $V_{c1}$ and $V_{c2}$ effects a change in frequency of the quadrature output signals by means of the mechanisms described hereinabove in relation to circuits 100 and 200, respectively. In particular, varying the first control voltage changes the capacitance of the varactors in the LC oscillators, whilst varying the second control voltage alters the transconductance coupling between the two LC oscillators. Using the two independently controllable inputs $V_{c1}$ and $V_{c2}$ allows the variable frequency signal generator according to embodiments of the invention to achieve wide-band and multi-band output frequency operation under low voltage, low power conditions, with favorable output signal characteristics. Details of the signal generator operation are described hereinbelow in connection with a preferred embodiment thereof in the form of a voltage controlled oscillator circuit 300 illustrated in FIG. 6.

Figure 6:
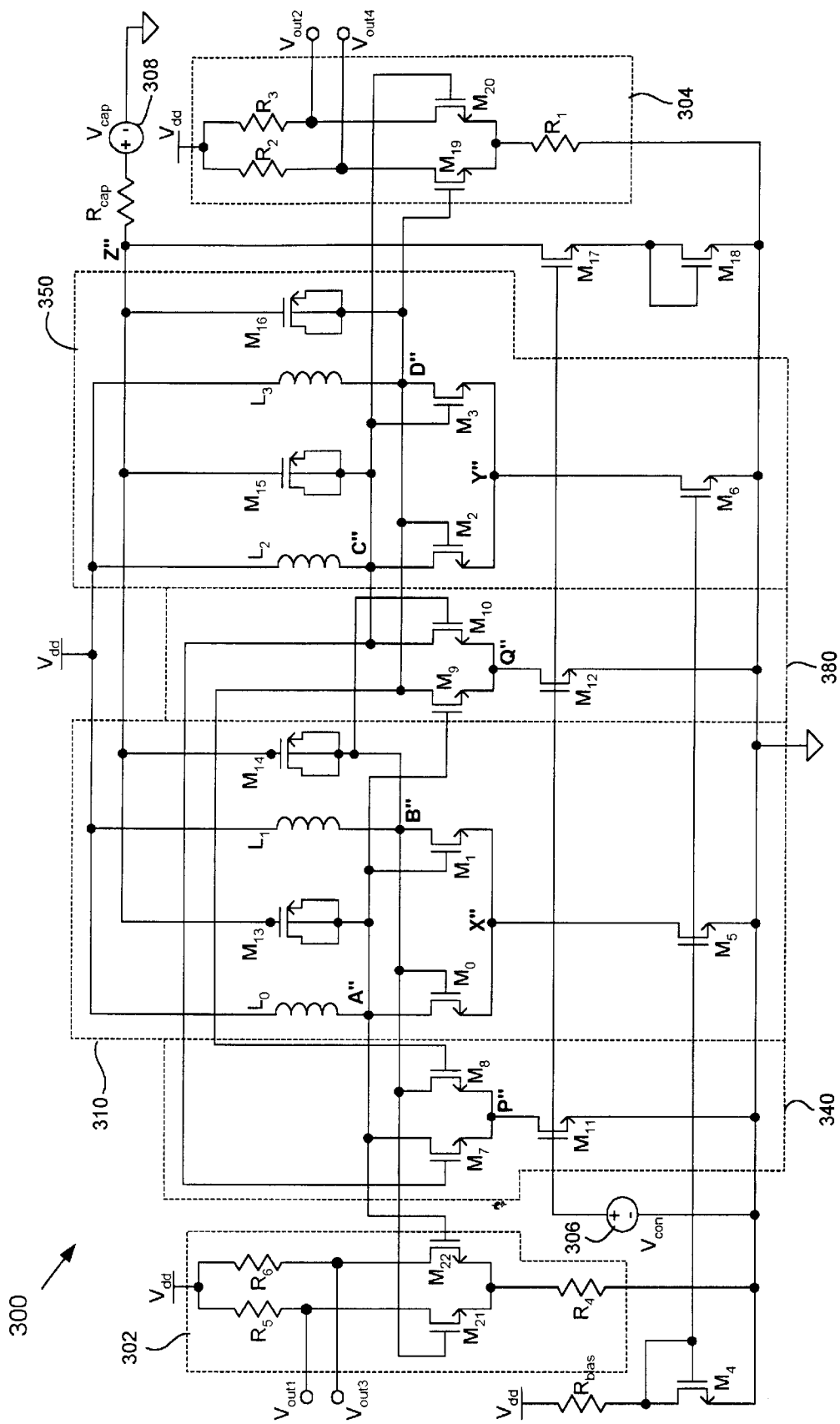
FIG. 6 is a schematic circuit diagram of a voltage controlled oscillator circuit according to a preferred embodiment of the present invention.

A wide-band/multi-band voltage controlled oscillator circuit 300 constructed according to a preferred embodiment of the present invention is illustrated in schematic diagram form in FIG. 6. The VCO circuit 300 has some structural similarities to the circuit 200 described hereinabove, having first and second oscillator circuits (310, 350) interconnected with first and second current injection circuits (340, 380). The VCO circuit 300 includes two control voltage inputs, namely a first control voltage $V_{cap}$ supplied to the first and second oscillator circuits, and a second control voltage $V_{con}$ supplied to the first and second current injection circuits. The circuit 300 as shown in FIG. 6 also includes buffer amplifier output stages 302, 304, that are included to provide 50 Ohm output impedance for the quadrature outputs.

The first oscillator circuit 310 has nodes A" and B" that are coupled through respective transistors $M_0$ and $M_1$ to a common node X". Inductors $L_0$ and $L_1$ are coupled between the respective nodes A" and B" and the supply voltage $V_{dd}$. MOSFET varactors $M_{13}$ and $M_{14}$ are coupled between the respective nodes A" and B" and a voltage control node Z". The transistors $M_0$ and $M_1$ provide cross-coupling between the nodes A" and B" in the oscillator circuit, wherein the gate of transistor $M_0$ is coupled to node B" and the gate of transistor $M_1$ is coupled to node A". The common node X" which interconnects the source terminals of transistors $M_0$, $M_1$ is coupled to ground through a current mirror transistor $M_5$. Electrical current that flows through the current mirror transistor $M_5$ is maintained substantially constant during operation by a reference current circuit comprising resistor $R_{bias}$ and transistor $M_4$ which are coupled to the transistor $M_5$ in a conventional current mirror arrangement.

The second oscillator circuit 350 is constructed similarly to the first oscillator circuit 310, having nodes C" and D" and a common node Y". Inductors $L_2$ and $L_3$ are connected between supply voltage $V_{dd}$ and nodes C" and D", respectively. MOSFET varactors $M_{15}$ and $M_{16}$ are coupled from the respective nodes C" and D" to the voltage control node Z". Transistor $M_2$ connects node C" to node Y" and is controlled from node D", whilst transistor $M_3$ interconnects nodes D" and Y" and is controlled from node C". Current through common node Y" is controlled through current mirror transistor $M_6$, which is regulated by the aforementioned reference current circuit comprising transistor $M_4$ and resistor $R_{bias}$.

The first current injection circuit 340 includes transistors $M_7$ and $M_8$ that have their source terminals connected in common to a node P". The node P" is coupled to ground through a current control transistor $M_{11}$ having its gate controlled by a voltage source 306 that provides a control voltage $V_{con}$. Transistor $M_7$ has its drain terminal coupled to node A" of the first oscillator circuit 310 and gate terminal coupled to node C" of the second oscillator circuit 350. Transistor $M_8$ has its drain terminal coupled to node B" of first oscillator circuit 310 and gate terminal coupled to node D" of oscillator circuit 350.

The second current injection circuit 380 has transistors $M_9$ and $M_{10}$ coupled to a common node Q", and the node Q" is coupled to ground through current control transistor $M_{12}$. The gate of transistor $M_{12}$ is controlled by the voltage $V_{con}$ from voltage source 306. Transistor $M_9$ has its drain terminal coupled to node D" of second oscillator circuit 350 and gate terminal coupled to node A" of first oscillator circuit 310. Transistor $M_{10}$ has its drain terminal coupled to node C" of second oscillator circuit 350 and gate terminal coupled to node B" of first oscillator circuit 310.

Each of the first and second oscillator circuits 310, 350 of the VCO circuit 300 have similar structure to the VCO circuit 100 illustrated in FIG. 1 and described hereinabove. In this case, however, the MOSFET varactors ($M_{13}$, $M_{14}$, $M_{15}$, $M_6$) of the oscillator circuits are controlled from the voltage control node Z", as described in greater detail hereinbelow. Varactor voltage control node Z" is supplied from a controllable voltage source 308, which provides a controlled voltage $V_{cap}$, through a resistor $R_{cap}$. The node Z" is also coupled to ground through a transistor $M_7$ controlled by the voltage $V_{con}$ from source 306, and a load transistor $M_{18}$.

The VCO circuit 300 of the preferred embodiment employs two separate control voltages in order to obtain a wide tuning range. In particular, the control voltage $V_{con}$ from voltage source 306 is coupled to control the current injection circuits 340, 380 in a similar manner to the tuning arrangement utilized in the VCO circuit 200 of FIG. 2. Varying the control voltage $V_{con}$ alters the transconductance of the current injection circuit transistors, which allows tuning of the oscillator circuits' resonant frequency as described above. Further, the control voltage $V_{cap}$ can be used to vary the potential at voltage control node Z", to thereby adjust the capacitance of the MOSFET varactors of the oscillator circuits. This also changes the oscillator circuit resonant frequency. By varying the two control voltages $V_{con}$ and $V_{cap}$ in concert, as described in detail below, it is possible to obtain wide-band and/or multi-band frequency tuning of the VCO circuit.

By having two independently controllable voltage input sources the VCO circuit 300 of the preferred embodiment is able to provide wideband or multi-band oscillator frequency operation. For example, one voltage input can be used as for frequency band selection, and the other voltage input to select the frequency within the band. If the frequency bands overlap one another then a wide band of oscillator output frequencies is available. Otherwise, separate non-overlapping frequency bands can be selected, enabling multi-band operation.

Figure 7:
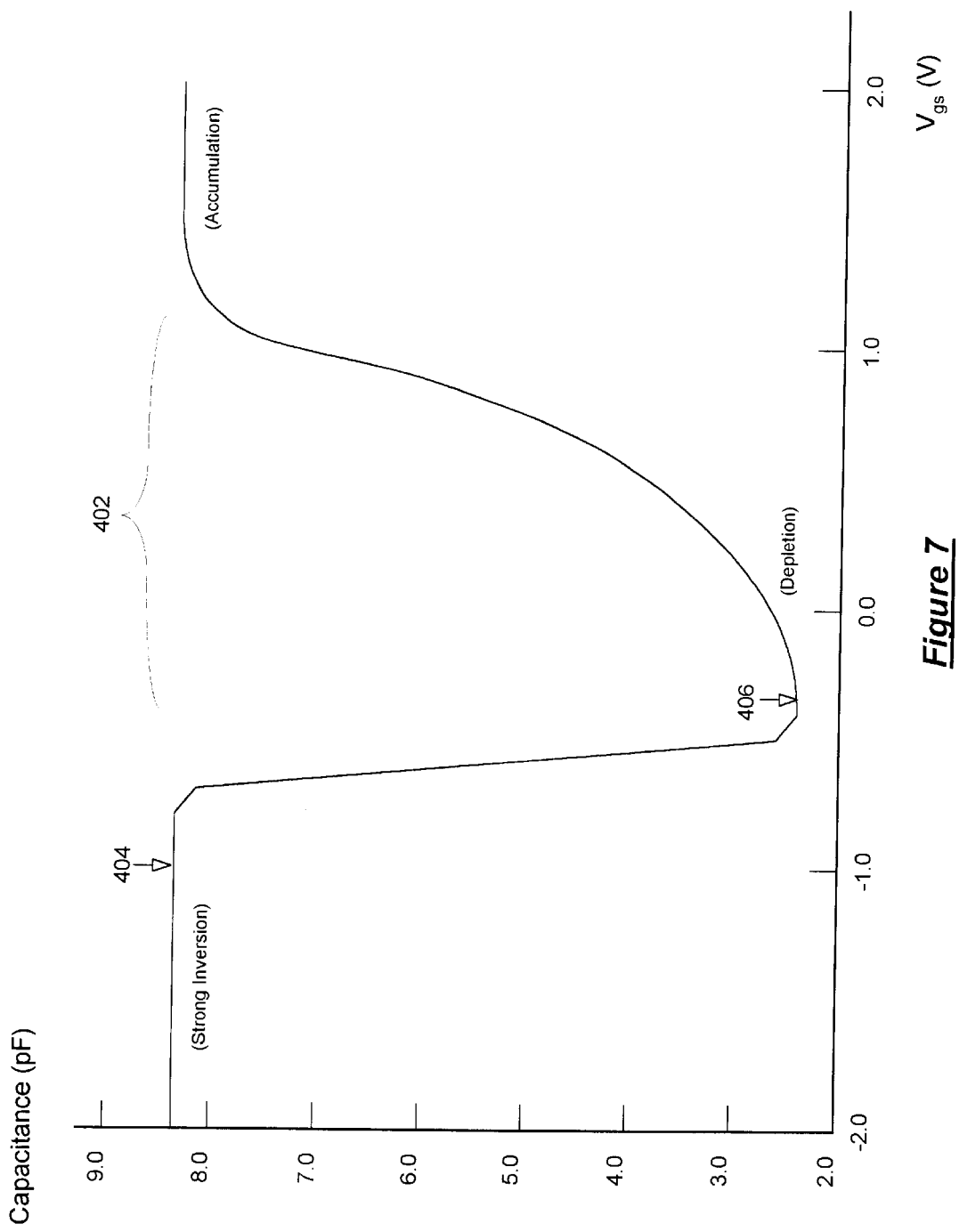
FIG. 7 is a graph illustrating capacitance variation with applied voltage for a varactor of the type employed in the circuit of the preferred embodiment.

It is useful to examine the way in which the first described VCO circuit 100 is typically operated in order to provide background into the operation of the circuit 300 of the preferred embodiment. FIG. 7 is a graph illustrating the variation of capacitance with voltage ($V_{gs}$) in a MOSFET varactor of the kind employed in VCO circuit 100. In order to provide continuously variable frequency tuning over a selected frequency range, the VCO circuit 100 is operated by controlling the voltage applied to the varactors 103, 105 so as to operate in the region indicated at 402 in FIG. 7. This region of the varactor voltage-capacitance characteristic is generally linear and permits the varactor to operate over substantially its full range of capacitance with by application of a relatively small variation in applied voltage.

In the preferred form of the present invention, the varactors $M_{13}$, $M_{14}$, $M_{15}$, $M_{16}$ of the oscillator circuits 310 and 350 are operated in a different manner to those of the VCO circuit 100. Referring again to FIG. 7, the circuit 300 is preferably controlled so that the MOSFET varactors operate at a selected one of the regions indicated at 404 and 406 on the characteristic graph. The regions 404 and 406 are at the extremes of the possible capacitance levels for the varactors, giving the greatest difference in oscillator frequencies in the VCO circuit. The varactor control voltage can therefore be used for frequency band selection. For example, the control voltage $V_{cap}$ can be applied to hold the varactor $V_{gs}$ voltage at the region 404 to obtain relatively low frequency output from the VCO. Alternatively the control voltage $V_{cap}$ can be applied to hold the varactor voltage $V_{gs}$ in the region 406 to obtain frequency outputs from the VCO in a relatively high frequency band. In this form of operation it is desirable to maintain the varactor voltage at a fixed level to maintain a particular frequency band of operation. Therefore the operating regions 404 and 406, as well as being at opposite ends of the capacitance range for the varactor, are chosen to be in the areas of the varactor capacitance characteristic at which the rate of change of capacitance with voltage is minimum (i.e. the slope of the capacitance curve is minimal).

With the varactor control voltage held constant to maintain a given frequency band, the cross-coupling control voltage $V_{con}$ from voltage source 306 (FIG. 6) can be adjusted to obtain the desired output frequency signal from the VCO circuit. Quadrature outputs are available between the nodes A" and C", or at B" and D", as for the VCO circuit 200 described above. The VCO circuit 300, however, also includes output buffer stages 302 and 304, coupled to the oscillator circuits at nodes A", B" and C", D" respectively. The output amplifiers 302, 304 are included to provide 50 Ohm output impedance for the quadrature outputs.

The first output amplifier 302 comprises transistors $M_{22}$ and $M_{21}$ driven from nodes A" and B" respectively. The drain terminals of transistors $M_{21}$ and $M_{22}$ are coupled to supply voltage $V_{dd}$ through respective resistors $R_5$ and $R_6$, and the source terminals are both coupled to ground through a resistor $R_4$. A first output $V_{out1}$ is provided at the drain of transistor $M_{21}$ and a second output $V_{out2}$ at the drain of transistor $M_{22}$. The second output amplifier is similarly constructed with transistors $M_{20}$ and $M_{19}$ driven from oscillator nodes C" and D", respectively. Resistors $R_2$ and $R_3$ couple the respective drains of $M_{19}$ and $M_{20}$ to supply voltage $V_{dd}$, and resistor $R_1$ couples the source terminals to ground. The third and fourth outputs ($V_{out3}$ and $V_{out4}$) for the VCO circuit 300 are provided at the source terminals of transistors $M_{20}$ and $M_{19}$). In order to provide 50 Ohm output impedance, the resistors $R_1$–$R_6$ are all of nominal 50 Ohm resistance.

As discussed above, the preferred mode of operation of the VCO circuit 300 involves setting the varactor control voltage at a selected one of a number of discrete voltage levels (thereby selecting a frequency range), and setting the cross-coupling control voltage to select a particular desired frequency within the selected frequency range. In order to facilitate enhanced operation in that manner, some additional circuitry is included in the VCO circuit 300 to minimize interactive effects of the two control voltage inputs. In particular, a control voltage compensation circuit is provided comprising transistors $M_{17}$ and $M_{18}$, and resistor $R_{cap}$. Resistor $R_{cap}$ as mentioned, is coupled between control voltage source 308, which provides control voltage $V_{cap}$, and the voltage control node Z". The transistor $M_{17}$ has its drain terminal coupled to the node Z" and gate terminal controlled by the voltage $V_{con}$. The source terminal of $M_{17}$ is coupled to ground through transistor $M_{18}$ which is arranged in the form of a load, with its drain and gate terminals coupled to the source of $M_{17}$ and its source coupled to ground.

The control voltage compensation circuit is provided to avoid changes in the control voltage $V_{con}$ from undesirably effecting changes in the control voltage at node Z". When the voltage $V_{con}$ is altered to adjust the frequency output of the VCO circuit, this has the effect of changing the voltage present at nodes A", B", C" and D" of the oscillator circuits. If the voltage at node Z" is kept constant then the voltage change at the nodes A"–D" will also have the effect of changing the voltage across the MOSFET varactors, which may cause the varactors to move out of the preferred operating region. In other words, without the compensation circuitry, changes in the control voltage $V_{con}$ intended to alter the oscillator output frequency by changing the cross-coupling transconductance ratios whilst the varactor capacitance remain constant can have the undesired effect of also changing the varactor capacitance. This can drive the varactors out of the intended operational regions (e.g. those regions identified at 404 and 406 on the varactor characteristic graph of FIG. 7), thereby altering the oscillator output frequency in an unintended way.

In view of the foregoing effects, the control voltage compensation circuitry provides voltage compensation for the varactors, to allow the voltage across the varactors to remain substantially constant when changes occur in the control voltage $V_{con}$. This is achieved by using the circuit path formed by transistors $M_{17}$ and $M_{18}$ to mirror changes in voltage which occur at nodes A"–D" at node Z" also. For example, an increase in the control voltage $V_{con}$ which will cause a decrease in the voltage levels at nodes A"–D" will also increase current through transistor $M_{17}$, thereby effecting a voltage drop across resistor $R_{cap}$ and a corresponding decrease in the voltage level at node Z". Thus, the voltage across varactors $M_{13}$, $M_{14}$, $M_{15}$, $M_{16}$ can be maintained substantially constant with varying control voltage $V_{con}$.

Figure 8:
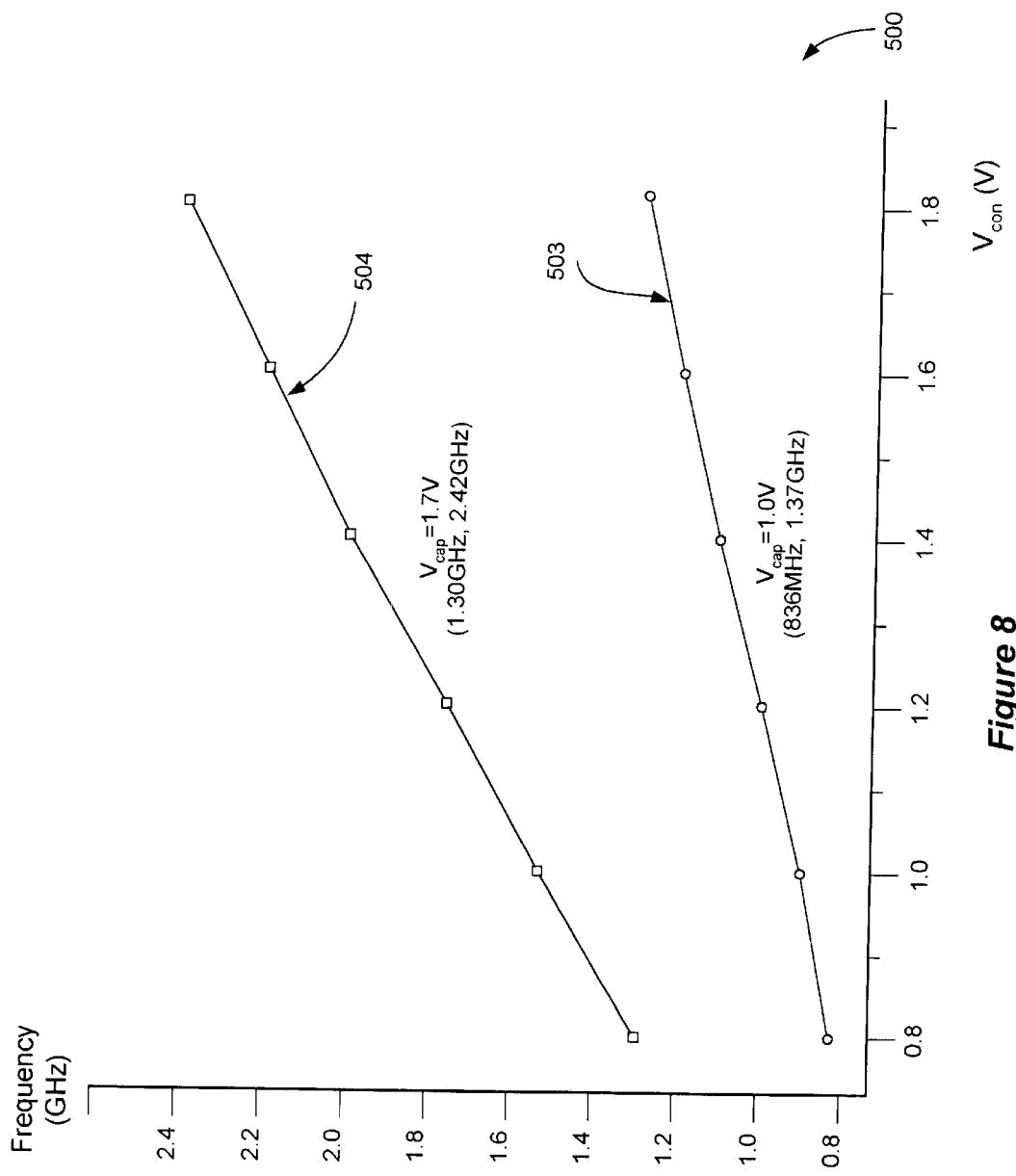
FIG. 8 is a graph illustrating oscillator frequency output variation with applied control voltages for the circuit of the preferred embodiment.

FIG. 8 is a graph of the input/output characteristics of the VCO circuit 300 of the preferred embodiment. The graph 500 plots control voltage $V_{con}$ (horizontal axis) against frequency of the oscillator outputs in GHz (vertical axis) for two values of control voltage input $V_{cap}$. The two lines in operating graph 500 correspond to the two $V_{cap}$ control voltage input levels, and represent two separate frequency bands over which the VCO can be tuned using the $V_{con}$ control voltage input. The first frequency band 503 corresponds to a $V_{cap}$ input voltage of 1.0 volts, which drives the varactors to operate in the region indicated at 404 in FIG. 7. The second frequency band 504 corresponds to a $V_{cap}$ input voltage of 1.7 volts, which drives the varactors to operate in the region indicated at 406 in FIG. 7.

With the VCO circuit operating in the first frequency band (503), the output frequency of the circuit 300 can be varied from 836 MHz to 1.37 GHz by varying the $V_{con}$ control voltage between 0.8 volts and 1.8 volts. Similarly, with the VCO circuit operating in the second frequency band (504), output frequencies of between 1.30 GHz and 2.42 GHz can be achieved with $V_{con}$ voltages between 0.8 volts and 1.8 volts. Since the first and second frequency bands overlap one another, the VCO 300 operating according to the characteristics of FIG. 8 performs as a wide-band voltage controlled oscillator, allowing generation of an output frequency anywhere between 836 MHz and 2.42 GHz with the appropriate application of input control voltages $V_{cap}$ and $V_{con}$. The VCO circuit 300 can also be operated in a multi-band mode, where the first and second frequency bands are discrete and non-overlapping by adjusting the nominal capacitance value of the MOSFET varactors and nominal inductance values of the inductors $L_0$, $L_1$, $L_2$, $L_3$.

The following results are obtained through simulation of the circuit 300 based on a 0.25 μm CMOS process with inductors of Q=4. The VCO 300 is operated at a supply voltage of $V_{dd}$=2 Volts and the total current consumption varies from 42.6 mA at 846 MHz to 96.8 mA at 2.42 GHz. Without the buffer amplifiers 302, 304 the current consumption can be reduced by 26.8 mA over the entire frequency range. As illustrated in FIG. 8, the VCO circuit 300 can be tuned over an extremely wide range of frequencies, from 846 MHz to 2.42 GHz, obtained by varying $V_{con}$ from 0.8 V to 1.8 V and $V_{cap}$ from 1.0 V to 1.7 V.

Figure 9:
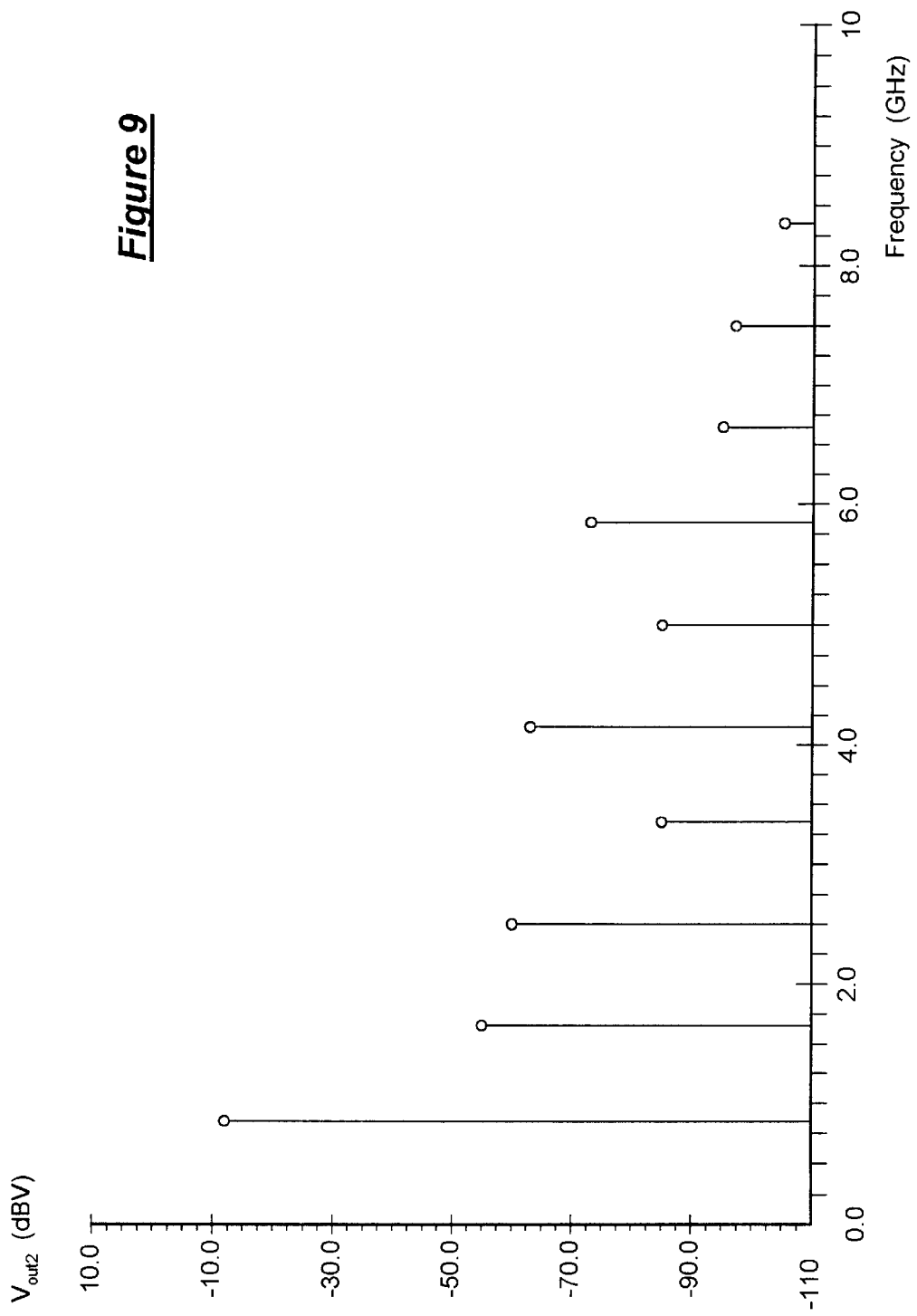
FIGS. 9 and 10 are graphs illustrating harmonic output content for the circuit of the preferred embodiment.
Figure 10:
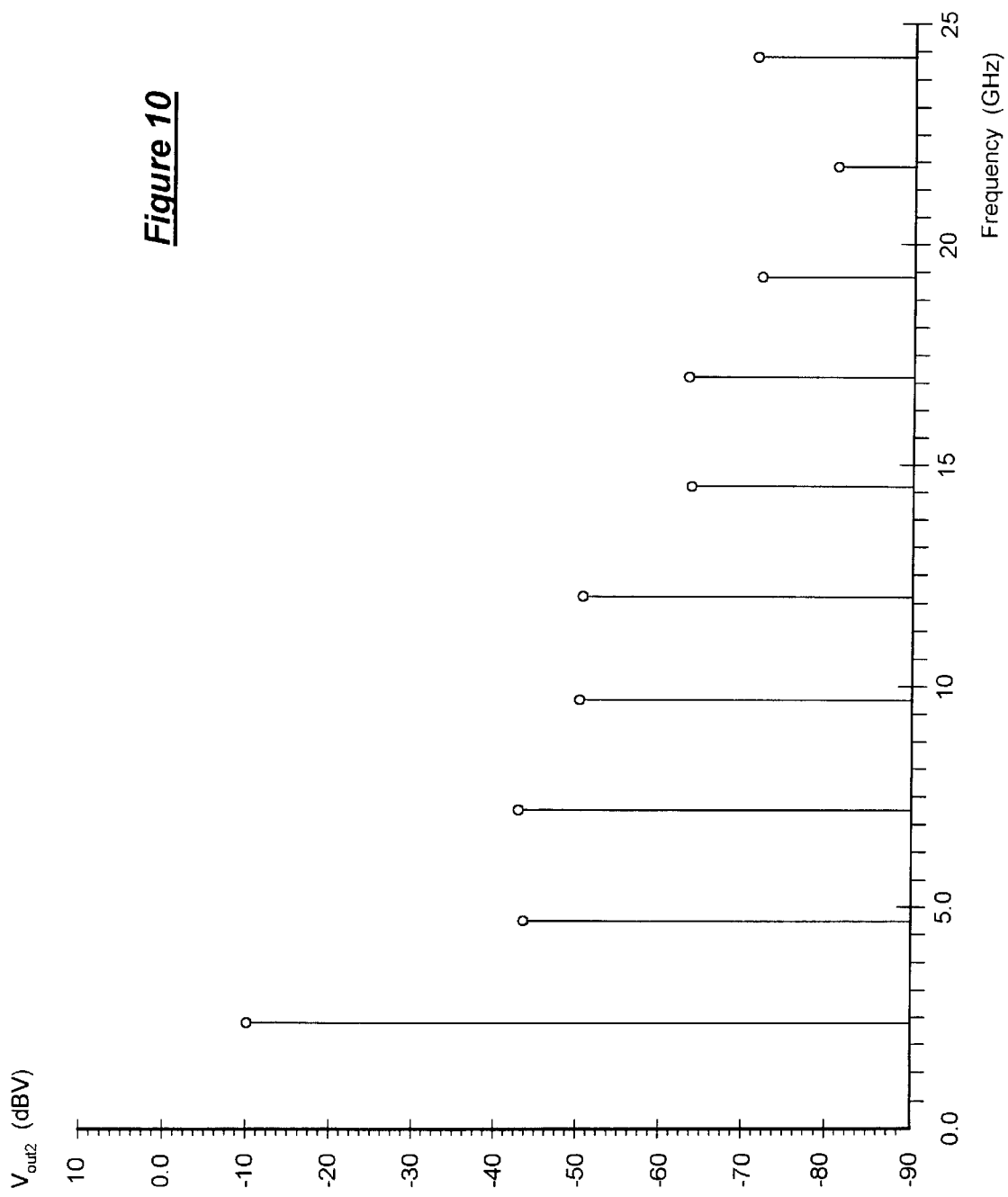

FIGS. 9 and 10 are graphs that represent the simulated harmonic contents of output signals generated by the VCO circuit 300 of the preferred embodiment. The graph of FIG. 9 illustrates the harmonic contents of the output $V_{out2}$ with the circuit 300 operating at a fundamental frequency of 846 MHz. In that case the largest harmonic component is the second harmonic, and the second harmonic minus the fundamental amounts to −41 dB. The graph of FIG. 10 illustrates the harmonic contents of the output $V_{out2}$ with the circuit operating at a fundamental frequency of 2.42 GHz, and in this case the second harmonic component minus the fundamental is −33.3 dB.

Figure 11:
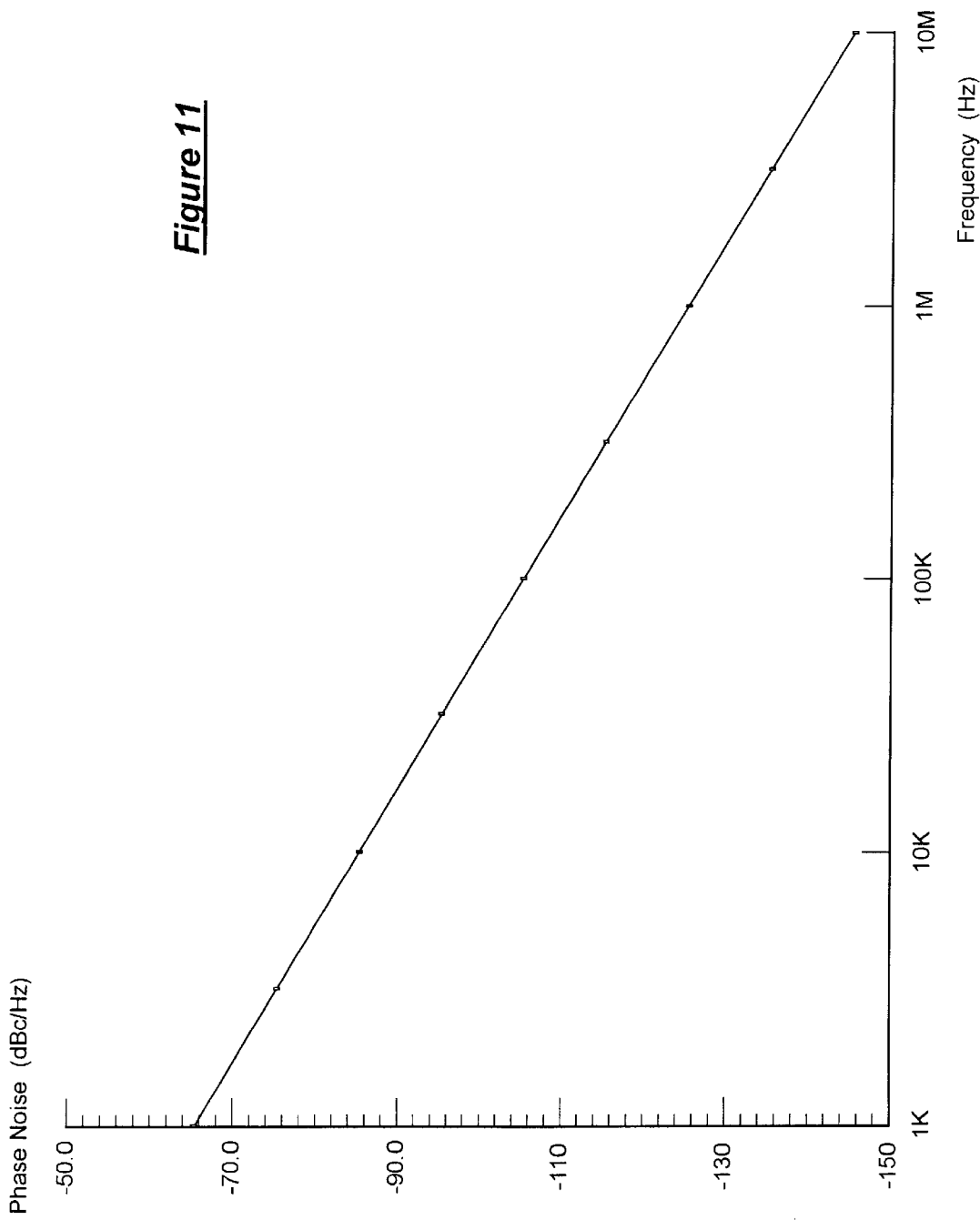
FIGS. 11 and 12 are graphs illustrating output phase noise for the circuit of the preferred embodiment.
Figure 12:
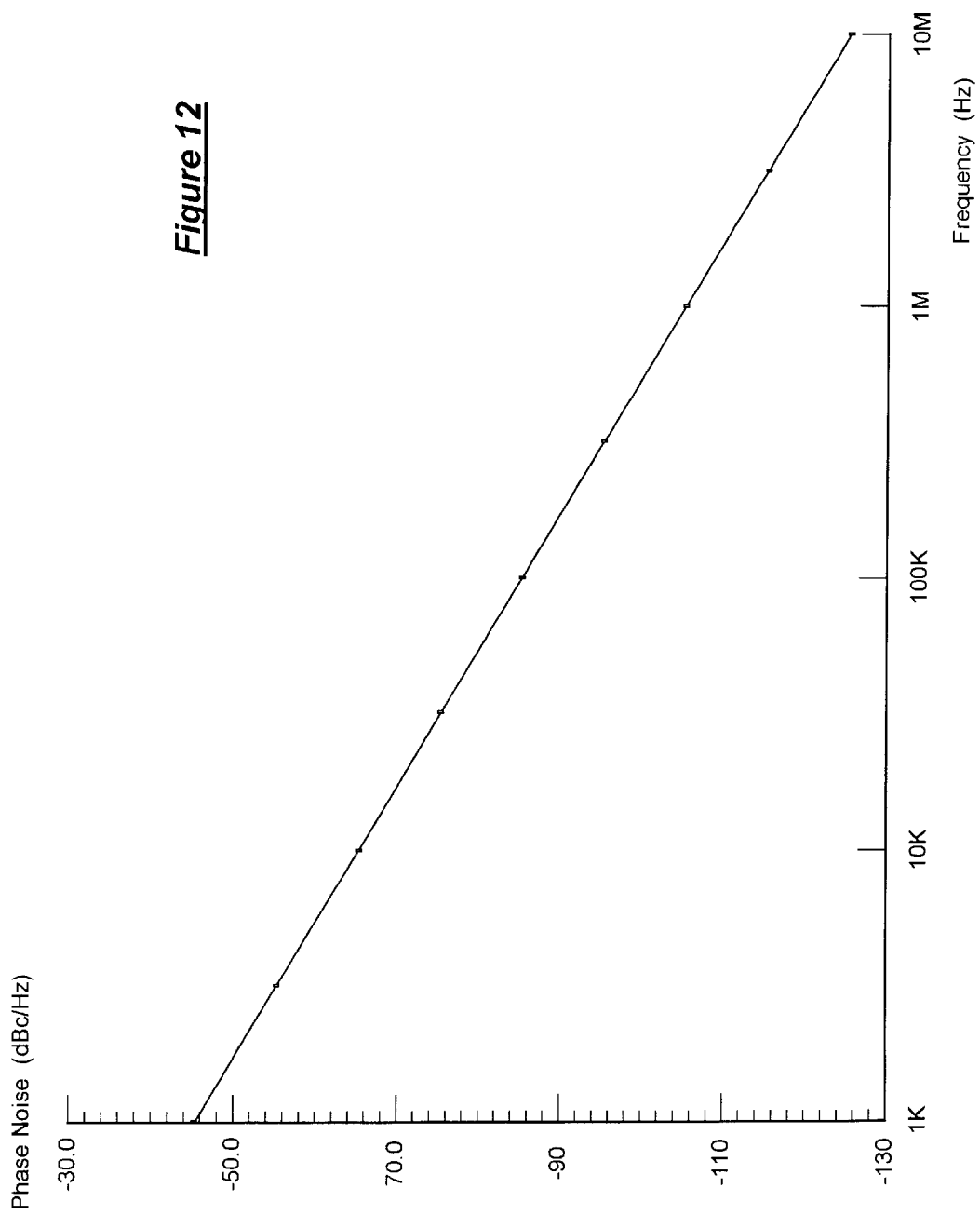

Table 1, below, shows the minimum and maximum simulated phase noise of the VCO 300 at the two extreme frequencies, 846 MHz and 2.42 GHz, for inductors of Q=4 and Q=5. The phase noise is estimated at offset frequencies of 200 kHz, 400 kHz, 1 MHz and 2 MHz. As the operating bandwidth of the GSM (Global System for Mobile Communication) system is 200 kHz, and estimate of phase noise at 400 kHz offset is commonly used as an indicator of VCO performance. Estimates of phase noise at larger offsets apply to wider band systems. In general the phase noise decreases linearly with respect to the offset frequency, as illustrated in the graphs of FIGS. 11 and 12 which indicate phase noise for oscillator frequencies of 846 MHz and 2.42 GHz respectively over a range of offset frequencies (represented on a logarithmic horizontal axis). The phase noise performance for the VCO circuit of the preferred embodiment matches or exceeds the performance of known prior art circuits.

TABLE 1

| | Phase noise performance | | | |
|---|---|---|---|---|
| Output | Q = 4 | | Q = 5 | |
| frequency | 846 MHz | 2.42 GHz | 846 MHz | 2.42 GHz |
| 200 kHz offset | −110.0 dBc/Hz | −91.0 dBc/Hz | −113.9 dBc/Hz | −91.3 dBc/Hz |
| 400 kHz offset | −117.0 dBc/Hz | −97.0 dBc/Hz | −120.0 dBc/Hz | −97.3 dBc/Hz |
| 1 MHz offset | −125.6 dBc/Hz | −105.0 dBc/Hz | −127.9 dBc/Hz | −105.3 dBc/Hz |
| 2 MHz offset | −131.0 dBc/Hz | −111.0 dBc/Hz | −134.0 dBc/Hz | −111.3 dBc/Hz |

The 90 degree phase shifted quadrature outputs are obtainable over the entire frequency range to an accuracy of at least 0.006 degrees under simulation conditions. The starting time of the VCO circuit is 70 ns at 846 MHz and 25 ns at 2.42 GHz. The single-ended peak-to-peak output increases from 413 mV at 846 MHz to 658 mV at 2.42 GHz.

The described VCO circuit is intended for fabrication in an integrated circuit, and has thus been described in the context of a 0.25 μm CMOS process. It will be appreciated by those of ordinary skill in the art, however, that the principles of the present invention are not restricted to a particular fabrication process, and circuits within the scope of the invention can be manufactured by means of any suitable fabrication technology. Preferably all of the components of the VCO circuit are formed on a single substrate, and the inductors ($L_0$, $L_1$, $L_2$, $L_3$), for example, may be formed from spiral structures etched in one or more metal layer of the integrated circuit, as is known in the art.

In view of the very wide tuning frequency range of VCO circuits according to embodiments of the present invention, many applications are possible in communication circuits and systems operating in the 900 MHz–2.5 GHz range. Software radio, for example, has been recognized as a major leap forward in mobile communications, to unite many existing worldwide air interface standards in the proposals for the future Universal Mobile Telecommunications systems (UMTS) operating over the 1800–2200 MHz range. The 2.4 GHz Industrial Scientific Medical (ISM) band also has numerous applications. The 846 MHz to 2.42 GHz bandwidth of the preferred embodiment VCO circuit is more than sufficient for the GSM systems and $3^{rd}$ generation UMTS, or the UMTS and ISM band systems. Furthermore, circuits according to the present invention are suitable for low voltage and low power applications, and the dual control voltages allow the circuits to operate as a wide-band or multi-band VCO. The accurate quadrature outputs are particularly useful in modem transceiver architectures using quadrature modulation.

The foregoing detailed description of the present invention has been presented by way of example only, and it is contemplated that changes and modifications may be made by one of ordinary skill in the art, to the materials and arrangements of elements of the present invention without departing from the scope of the invention. For example, various specific circuitry components, arrangements, fabrication techniques and modes of operation are described in connection with the preferred embodiment of the invention, but of course other components, arrangements, fabrication techniques and modes of operation may equally be used whilst remaining within the scope of the present invention.

We claim:

1. A variable frequency signal generator, comprising:
   first and second LC oscillator circuits including voltage controlled capacitance elements;
   a first control voltage input coupled to the LC oscillator circuits to control the capacitance of said voltage controlled capacitance elements;
   a transconductance control circuit cross-coupling said first and second LC oscillator circuits;
   a second control voltage input coupled to the transconductance control circuit to control transconductance coupling between the first and second oscillator circuits; and
   a variable frequency signal output coupled to generate an output signal from one of the first and second oscillator circuits, wherein the frequency of the output signal is controllable by independently controlling the voltages at the first and second control voltage inputs.

2. A variable frequency signal generator as claimed in claim 1, including a control voltage compensation circuit coupled between the first and second control voltage inputs, the control voltage compensation circuit substantially eliminating control signals applied at said second control voltage input from affecting the capacitance of said voltage controlled capacitance elements.

3. A variable frequency signal generator as claimed in claim 1, wherein each of said first and second LC oscillator circuits comprise:
   a pair of transistors cross-coupled to first and second common nodes; and
   a respective LC load coupled to each of the first and second common nodes, each LC load comprising an inductive element coupled between the common node and a supply voltage and a varactor capacitive element coupled between the common node and a controlled voltage node;
   wherein the first and second common nodes provide input/output connections for coupling to said transconductance control circuit and said variable frequency signal output.

4. A variable frequency signal generator as claimed in claim 3, wherein the transconductance control circuit comprises first and second coupling circuits, each coupling circuit having a pair of inputs and a pair of outputs, and wherein:
   the inputs of the first coupling circuit are coupled to the common nodes of the first oscillator circuit;
   the outputs of the first coupling circuit are coupled to the common nodes of the second oscillator circuit;
   the inputs of the second coupling circuit are coupled to the common nodes of the second oscillator circuit; and
   the outputs of the second coupling circuit are coupled to the common nodes of the first oscillator circuit.

5. A variable frequency signal generator as claimed in claim 4, wherein each of the coupling circuits comprises a pair of coupling transistors having first conduction nodes forming said coupling circuit outputs and second conduction nodes coupled to a supply voltage through a control transistor, the coupling transistors having control nodes forming said coupling circuit inputs, and said control transistor having a control node coupled to said second control voltage input.

6. A variable frequency signal generator as claimed in claim 5, wherein said control voltage compensation circuit includes a resistive element that provides a controlled voltage drop between said first control voltage input and said controlled voltage node so as to maintain the potential difference between the common nodes of said oscillator circuits and the controlled voltage node substantially constant with respect to changes in voltage at said second control voltage input.

7. A variable frequency signal generator as claimed in claim 1 which acts as a wide-band voltage controlled oscillator which is tunable to obtain output signals at said variable frequency signal output through at least the range of 900 MHz to 2200 MHz by application of control voltages at said first and second control voltage inputs.

8. A variable frequency signal generator comprising a pair of LC oscillator circuits interconnected by a transconductance control circuit, the oscillator circuits having outputs that in use provide respective quadrature frequency output signals, the transconductance control circuit having a second control voltage input effective in use to change the frequency of output signals from said oscillator circuits within a selected frequency band, and the oscillator circuits having a first control voltage input effective to change said selected frequency band.

9. A variable frequency signal generator as claimed in claim 8, wherein said transconductance control circuit controls transconductance coupling between the LC oscillator circuits in accordance with the second control voltage input.

10. A variable frequency signal generator as claimed in claim 9, wherein said LC oscillator circuits include varactors coupled to vary in capacitance according to said first control voltage input.

11. A variable frequency signal generator as claimed in claim 10, further comprising a control voltage compensation circuit coupled between the first and second control voltage inputs, the control voltage compensation circuit being controlled by said second control voltage input to regulate a bias voltage across said varactors wherein, with a constant voltage at said first control voltage input the bias voltage across said varactors is maintained substantially constant.

12. A variable frequency signal generator as claimed in claim 10, wherein each said LC oscillator circuit includes two varactors coupled between a control voltage node and respective oscillator output nodes, wherein said first control voltage input is applied to the oscillator circuits through said control voltage node.

13. A variable frequency signal generator as claimed in claim 12, wherein said transconductance control circuit is coupled to said oscillator output nodes.

14. A variable frequency signal generator as claimed in claim 11, further comprising a control voltage compensation circuit coupled between the second control voltage input and the control voltage node, the control voltage compensation circuit being controlled by said second control voltage input to regulate changes in voltage at said control voltage node in accordance with changes in voltage at said oscillator output nodes applied by said transconductance control circuit.

15. A method of operating a variable frequency signal generator having a pair of LC oscillator circuits interconnected by a transconductance control circuit, the oscillator circuits having outputs that in use provide respective quadrature frequency output signals, the oscillator circuits having a first control voltage input and the transconductance control circuit having a second control voltage input, the method comprising:

applying a first control voltage to the oscillator circuits through said first control voltage input, the first control voltage being selected from first and second predetermined voltage levels corresponding to first and second output signal frequency bands; and applying a second control voltage to the transconductance control circuit through said second voltage input, the second control voltage being within a predetermined voltage range corresponding to an output signal frequencies within the first and second frequency bands.

16. A method of operating a variable frequency signal generator as claimed in claim 15, wherein said oscillator circuits include MOSFET varactors, and wherein said first and second predetermined voltage levels correspond to said MOSFET varactors operating in respective inversion and depletion modes.

17. A method of operating a variable frequency signal generator as claimed in claim 15, wherein said first output signal frequency band substantially includes the range of 900 MHz to 1.3 GHz, and said second output signal frequency band substantially includes the range of 1.3 GHz to 2.4 GHz.

* * * * *